United States Patent
Hur et al.

(10) Patent No.: US 7,835,219 B2
(45) Date of Patent: Nov. 16, 2010

(54) MULTI-PORT MEMORY DEVICE

(75) Inventors: Hwang Hur, Kyoungki-do (KR); Jae-Il Kim, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 975 days.

(21) Appl. No.: 11/647,617

(22) Filed: Dec. 28, 2006

(65) Prior Publication Data

US 2008/0077747 A1 Mar. 27, 2008

(30) Foreign Application Priority Data

Sep. 21, 2006 (KR) ...................... 10-2006-0091628

(51) Int. Cl.
*G11C 8/00* (2006.01)

(52) U.S. Cl. ............................ 365/230.05; 365/230.03; 365/189.05

(58) Field of Classification Search ............ 365/230.05, 365/189.05, 220, 221, 219, 230.03
See application file for complete search history.

(56) References Cited

U.S. PATENT DOCUMENTS

| 7,046,576 B2 | 5/2006 | Kim et al. | |
|---|---|---|---|
| 7,089,465 B2 | 8/2006 | Lee | |
| 7,120,081 B2* | 10/2006 | Lee ........................ | 365/230.05 |
| 7,120,761 B2* | 10/2006 | Matsuzaki et al. .......... | 711/149 |
| 7,599,242 B2* | 10/2009 | Hur et al. ............... | 365/230.05 |
| 7,660,168 B2* | 2/2010 | Kim et al. .............. | 365/189.05 |
| 2006/0023562 A1 | 2/2006 | Kim et al. | |

FOREIGN PATENT DOCUMENTS

| CN | 1694181 | 11/2005 |
|---|---|---|
| CN | 1750400 | 3/2006 |
| KR | 1020050106852 | 11/2005 |
| KR | 1020050106871 | 11/2005 |
| KR | 1020050106906 | 12/2005 |
| KR | 1020060104396 | 10/2006 |

* cited by examiner

*Primary Examiner*—Tuan T Nguyen
*Assistant Examiner*—Toan Le
(74) *Attorney, Agent, or Firm*—Blakely, Sokoloff, Taylor & Zafman

(57) ABSTRACT

A multi-port memory device including a plurality of ports, a plurality of banks and a plurality of bank controllers, wherein all of the bank controllers share all of the ports, the device includes a phase locked loop (PLL) unit for generating an internal clock signal; a delay unit, provided in each bank controller, for generating first and second delayed clock signals by delaying the internal clock signal; a serializer, provided in each bank controller, for receiving a plurality of parallel data from all of the ports and fitting the parallel data for a corresponding data frame in response to the first delayed clock signal; and a command decoder, provided in each bank controller, for decoding output data of the serializer to generate command signals in response to the second delayed clock signal.

22 Claims, 6 Drawing Sheets

MULTI-PORT MEMORY DEVICE

FIELD OF THE INVENTION

The present invention relates to a multi-port memory device, and more particularly, to a bank control logic unit of a multi-port memory device having a command generating circuit.

DESCRIPTION OF RELATED ARTS

Currently, most dynamic random access memory (DRAM) are used in a high definition television (HDTV) and a liquid crystal display (LCD) TV as well as traditional devices such as a desktop computer, a notebook computer and a server. Accordingly, there is a demand for a new data communication instead of a conventional data communication having a single port with a plurality of input/output (I/O) pin sets, i.e., a parallel I/O interface.

FIG. 1 is a block diagram of a conventional single port memory device. For convenience of explanation, a conventional x16 512M DRAM device having eight banks as the single port memory device is illustrated.

The conventional x16 512M DRAM device includes a plurality of memory cells, first to eighth banks BANK0 to BANK7, a single port PORT, and a plurality of global input/output (I/O) data buses GIO. The plurality of memory cells is arranged with a plurality of N×M memory cells having a matrix form, M and N being positive integers. The first to eighth banks BANK0 to BANK7 include a row/column decoder for selecting a specific memory cell by row and column lines. The single port PORT controls signals inputted from or outputted to the first to eighth banks BANK0 to BANK7. The global I/O data buses GIO transfers signals between the single port and the banks, and between the single port and input/output (I/O) pins. Referring to FIG. 1, the global I/O data buses GIO include a control bus, fifteen address buses and sixteen data buses.

As described above, the single port memory device includes only a single port with a plurality of I/O pin sets for transferring data signals between the single port memory device and external devices via an external chipset.

A process for transferring signals from the banks to the external devices is described. The signals outputted from the first to eighth banks BANK0 to BANK7 through the sixteen data buses are transferred to the external devices in parallel through the external chipset by way of the single port PORT.

A process for transferring signals from the external devices to the banks is described. The signals outputted from the external devices in parallel through the external chipset are transferred to the single port PORT, and then are transferred to the first to eighth banks BANK0 to BANK7 through the sixteen data buses. The transferred signals are transferred to the memory cells under the control of a control unit provided within the banks, e.g., a decoder and a driver.

Meanwhile, the signals transferred to the external devices from the first to eighth banks BANK0 to BANK7 include an address and a command as well as data signals. The address and command are transferred to the single port PORT from the external devices in parallel via extra input/output address and command pins except for the sixteen data buses. The command transferred to the single port PORT is inputted to the banks through the single control bus, and the address transferred to the single port PORT is inputted to the banks through the fifteen address buses.

However, in the single port memory device, it is difficult to implement various multimedia functions because the single port memory device uses only one port. To implement the various multimedia functions in the single port memory device, each DRAM device has to be constituted independent of each other so as to perform its unique function. When the DRAM devices are constituted independent of each other, it is difficult to allocate a proper memory amount between memory devices based on the number of access times. As a result, an efficiency of utilization to density of the whole memory device is decreased.

For reference, there is suggested a semiconductor memory device described in a commonly owned copending application, U.S. Ser. No. 11/528,970, filed on Sep. 27, 2006, entitled "MULTI-PORT MEMORY DEVICE WITH SERIAL INPUT/OUTPUT INTERFACE".

FIG. 2 is a block diagram of a multi-port memory device described in accordance with Korea application No. 2006-0032948. For convenience of explanation, the multi-port memory device having four ports and eight banks is illustrated. Particularly, it is assumed that the multi-port memory device has a 16-bit data frame and performs a 64-bit prefetch operation.

The multi-port memory device includes first to fourth ports PORT0 and PORT3, first to eighth banks BANK0 to BANK7, first and second global input/output (I/O) data buses GIO_OUT and GIO_IN, first to eighth bank control logic units BCL0 to BCL7, and a phase locked loop (PLL) 101.

Each of the first to fourth ports PORT0 and PORT3 located at a center of a core is arranged in a row direction, and performs a serial data communication with its own external device independent of each other. The first to eighth banks BANK0 to BANK7 are divided into upper banks BANK0 to BANK3 and lower banks BANK4 to BANK7 based on the first to fourth ports PORT0 to PORT3 and arranged in the row direction.

The first global I/O bus GIO_OUT is arranged in the row direction between the upper banks BANK0 to BANK3 and the first to fourth ports PORT0 to PORT3, and transmits output data in parallel. The second global I/O bus GIO_IN is arranged in the row direction between the lower banks BANK4 to BANK7 and the first to fourth ports PORT0 to PORT3, and transmits input data in parallel.

The first to eighth bank control logic units BCL0 to BCL7 control a signal transmission between the first and second global I/O buses GIO_OUT and GIO_IN and the first to eighth banks BANK0 to BANK7.

The PLL 101 is located between the second port PORT1 and the third port PORT2 and generates an internal clock for synchronizing internal commands and I/O data applied to the first to fourth ports PORT0 to PORT3.

The multi-port memory device can be used as a memory device of a digital device for processing mass data at a high speed because the multi-port memory device includes the plurality of ports PORT0 to PORT3 and each port can perform its own operation independently.

The multi-port memory device generates addresses and internal commands by receiving input parallel data from the first to fourth ports PORT0 to PORT3. Further, the multi-port memory device recognizes whether the input parallel data are addresses/internal commands or data based on a predetermined protocol, i.e., data frames.

FIG. 3 illustrates data frame formats of the multi-port memory device shown in FIG. 2. Specifically, FIGS. 3A to 3F illustrate a basic data frame format, a write command frame format, a write data frame format, a read command frame format, a read data frame format, and a command frame format, respectively.

Referring to FIG. 3B, the write command frame is a unit of 20-bit serialized signals input from the external devices. $18^{th}$ and $19^{th}$ bits "PHY" among the 20-bit serialized signals correspond to a physical link coding bit which is substantially not used, a $17^{th}$ bit "CMD" means a command start point, a $16^{th}$ bit "ACT" indicates an internal active state, a $15^{th}$ bit "WT" corresponds to an internal write command, and a $14^{th}$ bit "PCG" indicates an internal inactive state. For example, during a normal write operation, $17^{th}$ to $14^{th}$ bits become "1010". During an auto-precharge write operation, $17^{th}$ to $14^{th}$ bits become "1011". $13^{th}$ to $10^{th}$ bits "UDM" are used as an upper-byte write data mask signal of write data applied over four clocks, $9^{th}$ to $6^{th}$ bits "BANK" mean bank information during the write operation, and the $5^{th}$ to $0^{th}$ bits "COLUMN ADDRESS" mean a column address.

Referring to FIG. 3C, $18^{th}$ and $19^{th}$ bits "PHY" of the write data frame correspond to a physical link coding bit which is substantially not used, a $17^{th}$ bit "CMD" means a command start point, a $16^{th}$ bit "LDM" is used as a lower-byte write data mask signal of the write data, and each of $15^{th}$ to $8^{th}$ bits "UPPER BYTE" and $7^{th}$ to $0^{th}$ bits "LOWER BYTE" means an upper byte and a lower byte of the write data, respectively. Herein, if the write data is normally applied, the $17^{th}$ bit "CMD" becomes a logic low level "0".

Referring to FIG. 3D, $18^{th}$ and $19^{th}$ bits "PHY" of the read command frame correspond to a physical link coding bit which is substantially not used, a $17^{th}$ bit "CMD" means a command start point, a $16^{th}$ bit "ACT" indicates an internal active state, a $15^{th}$ bit "WT" corresponds to an internal write command, a $14^{th}$ bit "PCG" indicates an internal inactive state and a $13^{th}$ bit "RD" is indicates a read command. For a normal read operation, the $17^{th}$ to $13^{th}$ bits become "10001". During an auto-precharge read operation, the $17^{th}$ to $13^{th}$ bits become "10011".

Meanwhile, a $12^{th}$ bit "ESC" of the read command frame indicates a command expansion bit. For instance, if the $17^{th}$ bit "CMD" is a logic high level "1", the $14^{th}$ bit "PCG" is a logic high level "1", and the $13^{th}$ bit "RD" is a logic high level "1", all banks perform a precharge operation. That is, the precharge operation or an auto refresh operation of all banks is performed by using the command expansion bit "ESC" and other command bits because there is no command representing "PRECHARGE ALL" bit.

An $11^{th}$ bit "ABNK" of the read command frame indicates a bank active bit setting while the $13^{th}$ bit "RD" is set. $9^{th}$ to $6^{th}$ bits "BANK" mean bank information during the read operation, and the $5^{th}$ to $0^{th}$ bits "COLUMN ADDRESS" mean a column address.

Referring to FIG. 3E, $18^{th}$ and $19^{th}$ bits "PHY" of the read data frame correspond to a physical link coding bit which is substantially not used, and each of $15^{th}$ to $8^{th}$ bits "UPPER BYTE" and $7^{th}$ to $0^{th}$ bits "LOWER BYTE" means an upper byte and a lower byte of the read data, respectively.

The multi-port memory device using the above data frames receives and transmits parallel data from the memory cells via the first and second global I/O data buses GIO_OUT and GIO_IN. Herein, because the first and second global I/O data buses GIO_OUT and GIO_IN have lots of lines, the first to eighth bank control logic units BCL0 to BCL7 share the first and second global I/O data buses GIO_OUT and GIO_IN.

The multi-port memory device generates commands and addresses based on the parallel data. The conventional DRAM device decodes the commands input from command pins, and transmits the decoded commands to the banks. On the other hand, the multi-port memory device for concurrently performing various operations requires a new method to generate commands and addresses, different from that of the conventional DRAM device.

SUMMARY OF THE INVENTION

It is, therefore, an object of the present invention to provide a multi-port memory device for simultaneously generating internal commands of each bank control logic unit.

It is, therefore, another object of the present invention to provide a multi-port memory device for simultaneously applying parallel data to each bank control logic unit.

In accordance with an aspect of the present invention, there is provided a multi-port memory device having a plurality of ports, a plurality of banks and a plurality of bank controllers, wherein all of the bank controllers share all of the ports, the device includes: a phase locked loop (PLL) unit for generating an internal clock signal; a delay unit, provided in each bank controller, for generating first and second delayed clock signals by delaying the internal clock signal; a serializer, provided in each bank controller, for receiving a plurality of parallel data from all of the ports and fitting the parallel data for a corresponding data frame in response to the first delayed clock signal; and a command decoder, provided in each bank controller, for decoding output data of the serializer to generate command signals in response to the second delayed clock signal.

In accordance with a further aspect of the present invention, there is provided a multi-port memory device including: a plurality of ports for performing a serial input/output (I/O) communication with external devices; a plurality of banks for performing a parallel I/O communication with the ports through a plurality of global I/O lines; a plurality of bank controllers, each corresponding to each of the banks, for sharing the plurality of global I/O lines and controlling the parallel I/O communication between the ports and the banks; and a phase locked loop (PLL) unit for generating an internal clock signal and simultaneously transmitting the internal clock signal to the bank controllers, wherein each of the bank controllers includes a command signal generating unit for simultaneously generating command signals in response to the internal clock signal.

DETAILED DESCRIPTION OF THE INVENTION

Hereinafter, a multi-port memory device in accordance with exemplary embodiments of the present invention will be described in detail with reference to the accompanying drawings.

Figure 1:
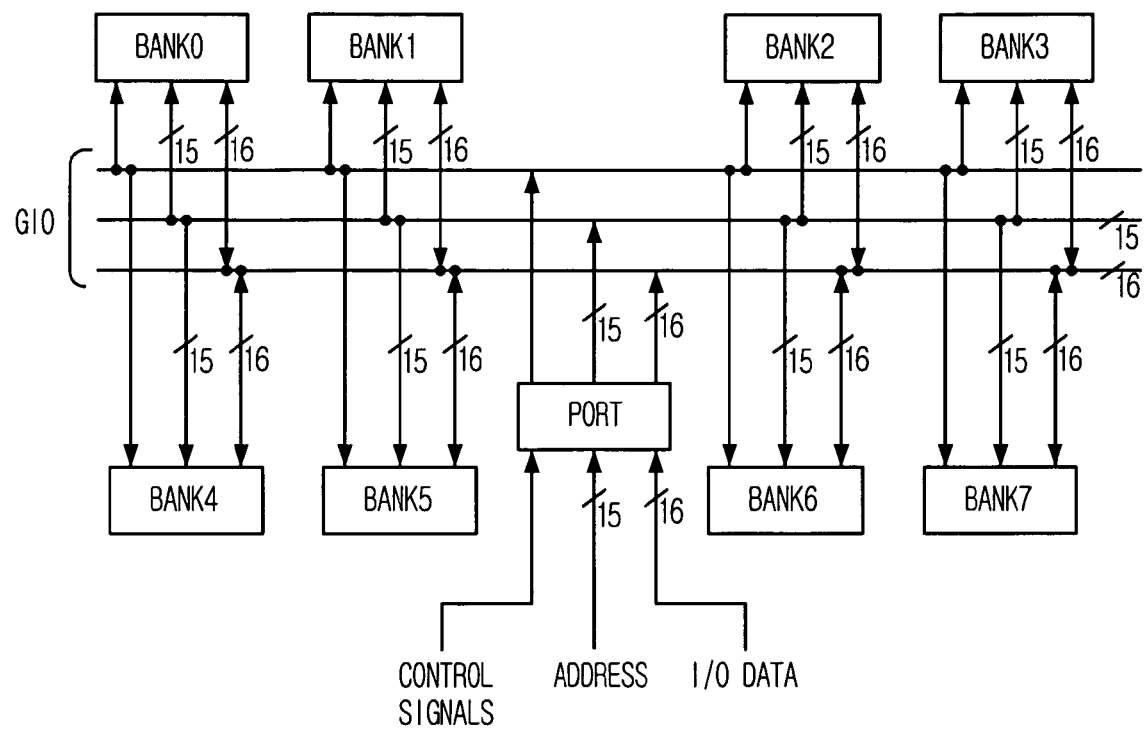
FIG. 1 is a block diagram of a conventional single-port memory device.
Figure 2:
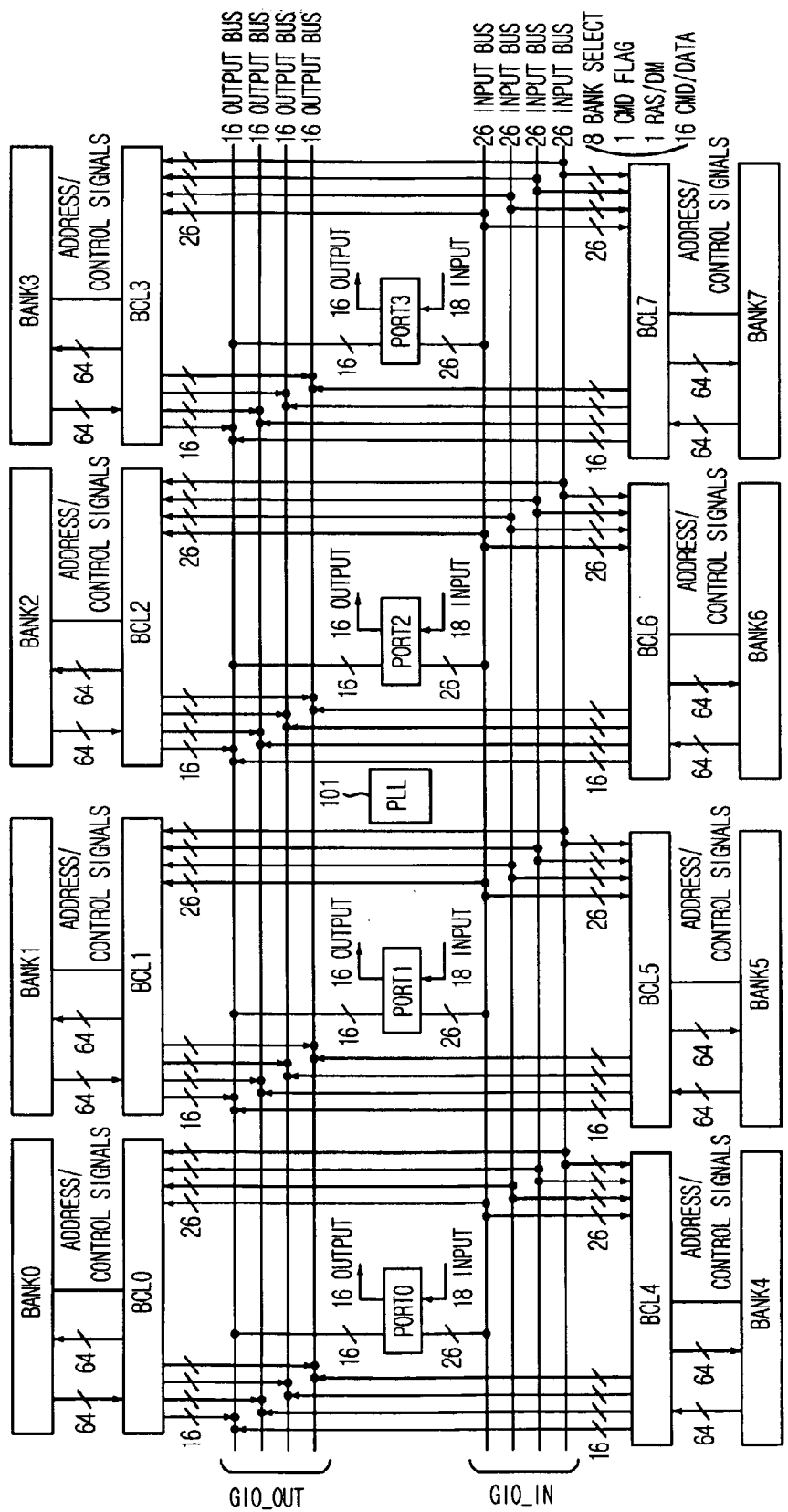
FIG. 2 is a block diagram of a multi-port memory device described in accordance with Korea application No. 2006-0032948.
Figure 3A:
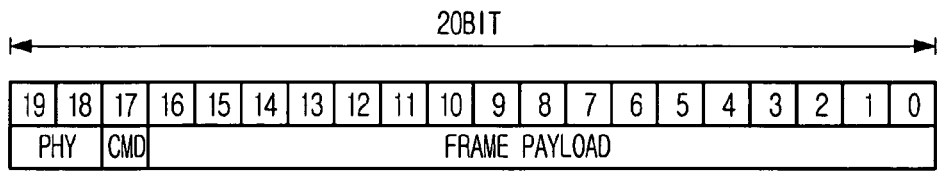
FIG. 3 illustrates data frames of the multi-port memory device shown in FIG. 2.
Figure 3B:
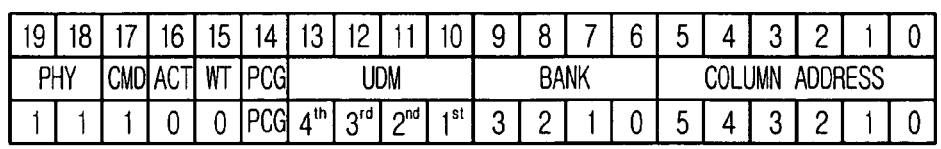
Figure 3C:
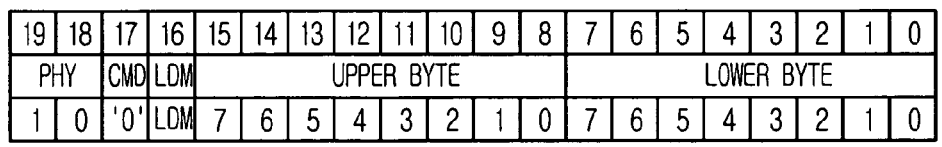
Figure 3D:
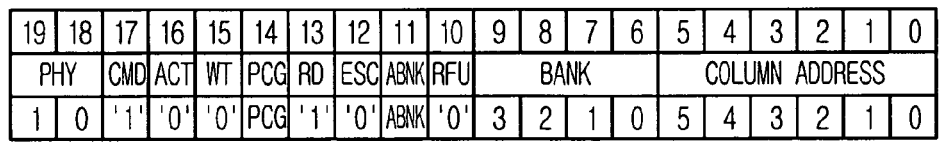
Figure 3E:
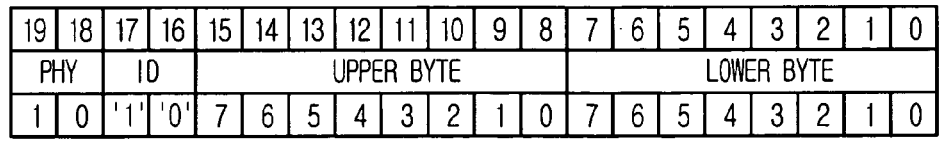
Figure 3F:
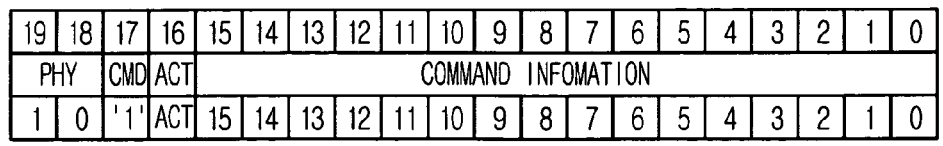
Figure 4:
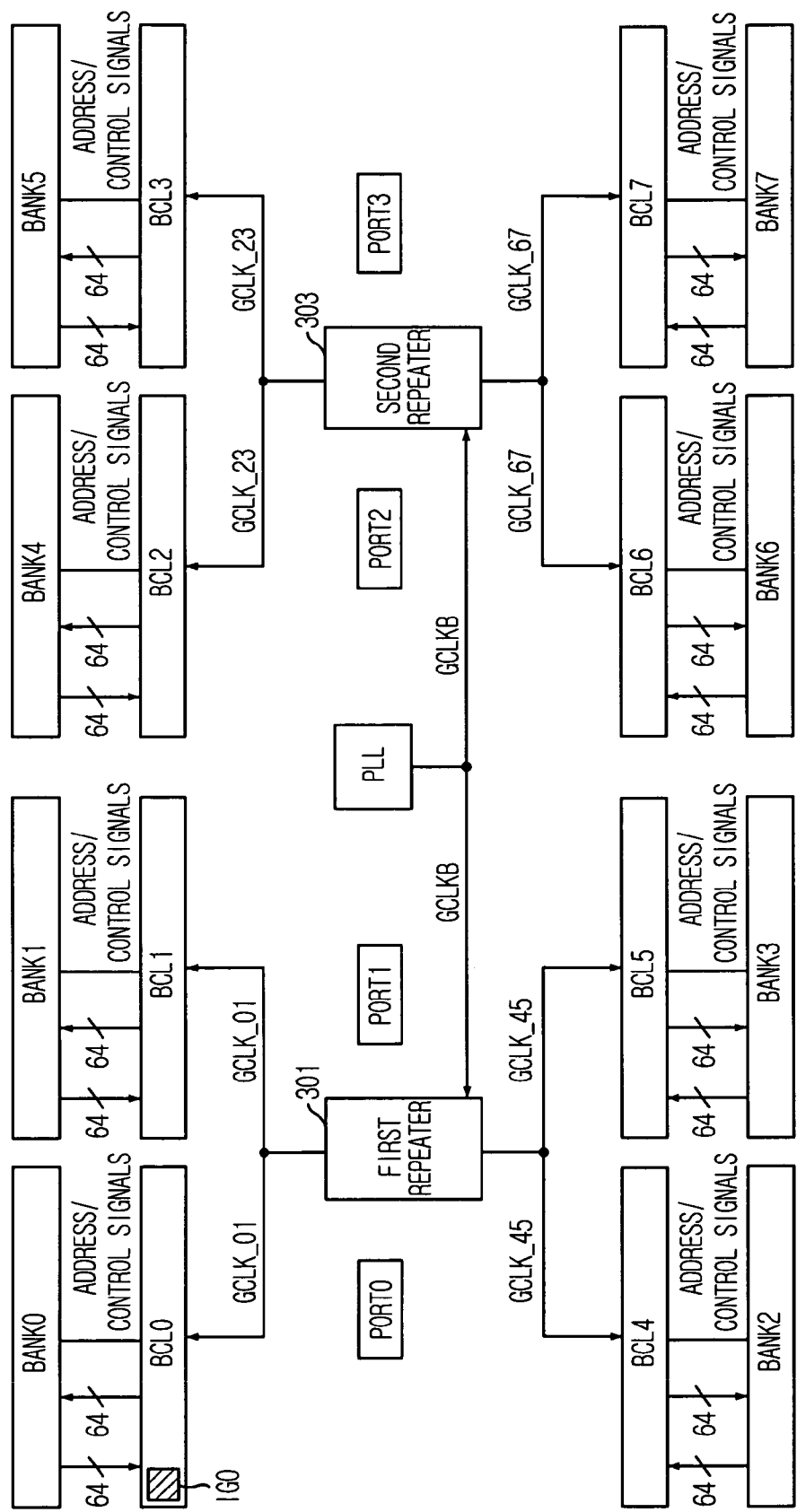
FIG. 4 is a block diagram of a multi-port memory device in accordance with an embodiment of the present invention.

FIG. 4 is a block diagram of a multi-port memory device in accordance with an embodiment of the present invention.

The present invention delays a clock signal for clocking an input/output of parallel data which is generated by a PLL and output from each of first to fourth ports PORT0 to PORT3, and generates command signals after all of the parallel data are applied. Herein, the parallel data are applied with a time lag due to a loading difference.

As shown in FIG. 4, because a global clock bar signal GCLKB output from the PLL is transmitted to all constituents of the multi-port memory device, the global clock bar signal GCLKB has a great loading time to thereby occur a skew at each bank. To minimize the skew at each bank, the multi-port memory device of the present invention includes a first repeater 301 between the first port PORT0 and the second port PORT1, and a second repeater 303 between the third port PORT2 and the fourth port PORT3, each repeater for repeating the global clock bar signal GCLKB output from the PLL.

The first repeater 301 receives the global clock bar signal GCLKB from the PLL to generate first sub-global clock signal GCLK_01 and second sub-global clock signal GCLK_23. The first sub-global clock signal GCLK_01 is input to first and second bank control logic units BCL0 and BCL1 as an internal clock signal and the second sub-global clock signal GCLK_23 is input to third and fourth bank control logic units BCL2 and BCL3 as an internal clock signal.

The second repeater 303 receives the global clock bar signal GCLKB to generate third sub-global clock signal GCLK_45 and fourth sub-global clock signal GCLK_67. The third sub-global clock signal GCLK_45 is input to fifth and sixth bank control logic units BCL4 and BCL5 as an internal clock signal and the fourth sub-global clock signal GCLK_67 is input to seventh and eighth bank control logic units BCL6 and BCL7 as an internal clock signal.

As described above, the first and second repeaters 301 and 303 repeat the global clock bar signal GCLKB and generate a plurality of sub-global clock signals, each for inputting a corresponding one of the bank control logic units BCL0 to BCL7 at the same time. As a result, the skew between the bank control logic units BCL0 to BCL7 can be removed, and thus, the command signals of each bank control logic unit BCL0 to BCL7 are simultaneously generated.

Figure 5:
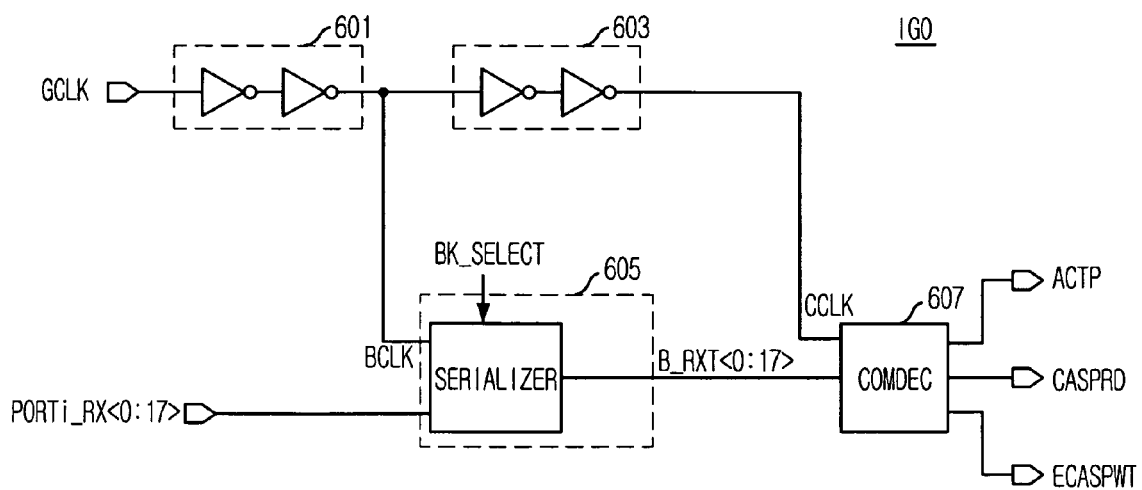
FIG. 5 is a block diagram of a first command signal generating unit provided in a first bank control logic unit of the multi-port memory device shown in FIG. 4.

FIG. 5 is a block diagram of a first command signal generating unit IG0 provided in the first bank control logic unit BCL0 of the multi-port memory device shown in FIG. 4. The other command signal generating units provided in the second to eighth bank control logic units BCL1 to BCL7 have substantially the same structure as that of the first command signal generating unit IG0 provided in the first bank control logic unit BCL0.

The first command signal generating unit IG0 includes first and second delay units 601 and 603, a serializer 605 and a command decoder 607.

The first delay unit 601 delays the global clock bar signal GCLKB by a predetermined time to generate a first delayed clock signal BCLK. The second delay unit 603 delays the first delayed clock signal BCLK by a predetermined time to generate a second delayed clock signal CCLK. The serializer 605 receives a plurality of parallel data PORTi_RX<0:17> from the first and fourth ports PORT0 to PORT3, i being a positive integer corresponding to the number of ports, to fit the parallel data for a corresponding data frame in response to the first delayed clock signal BCLK. Herein, the serializer 605 can be implemented with a flip-flop. The command decoder 607 decodes output data B_RXT<0:17> output from the serializer 605 to generates the command signals such as an active command signal ACTP, a read command signal CASPRD and a write command signal ECASPWT, in response to the second delayed clock signal CCLK.

As described above, the present invention repeats the global clock bar signal GCLKB to thereby generate the sub-global clock signals GCLK_01 to GCLK_67 having different delay times according to the bank control logic units BCL0 to BCL7. As a result, all of the bank control logic units BCL0 to BCL7 receive the parallel data PORTi_RX<0:17> from the first and fourth ports PORT0 to PORT3 in response to its own sub-global clock signal.

Further, the command signal generating unit of each bank control logic unit BCL0 to BCL7 uses the first delayed clock signal BCLK generated by delaying the global clock bar signal GCLKB, and the second delayed clock signal CCLK generated by delaying the first delayed clock signal BCLK. Herein, the first delayed clock signal BCLK is generated by delaying the global clock bar signal GCLKB until all of the parallel data PORTi_RX<0:17> are applied. Accordingly, the parallel data PORTi_RX<0:17> are applied and output as the output data B_RXT<0:17> in response to the first delayed clock signal BCLK, and the command signals are generated in response to the second delayed clock signal CCLK.

Therefore, in the present invention, though the parallel data PORTi_RX<0:17> are applied with the time lag due to the loading difference between the bank control logic units BCL0 to BCL7, the command signals are simultaneously generated after all of the parallel data PORTi_RX<0:17> are applied.

Figure 6:
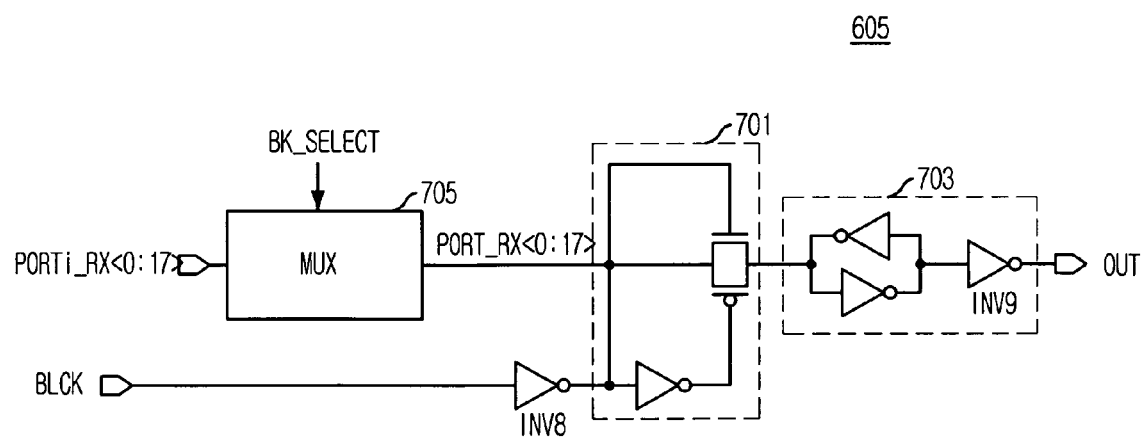
FIG. 6 is a circuit diagram of a serializer of the first command signal generating unit shown in FIG. 5.

FIG. 6 is a circuit diagram of the serializer 605 of the first command signal generating unit shown in FIG. 5.

The serializer 605 includes a transmission unit 701, a latch unit 703, a multiplexing unit 705, and first and second inverters INV8 and INV9.

The multiplexing unit 705 selects one of the plurality of parallel data PORTi_RX<0:17> from the first and fourth ports PORT0 to PORT3 in response to the bank selection signal $BK_{13}$ SELECT, and fits the selected parallel data POR-T_RX<0:17> for the corresponding data frame. The first inverter INV8 inverts the first delayed clock signal BCLK. The transmission unit 701 transmits the selected parallel data PORT_RX<0:17> in response to an output of the first inverter INV8. The latch unit 703 latches an output of the transmission unit 701. The second inverter INV9 inverts an output of the latch unit 703 to output the output data B_RXT<0:17>.

Figure 7:
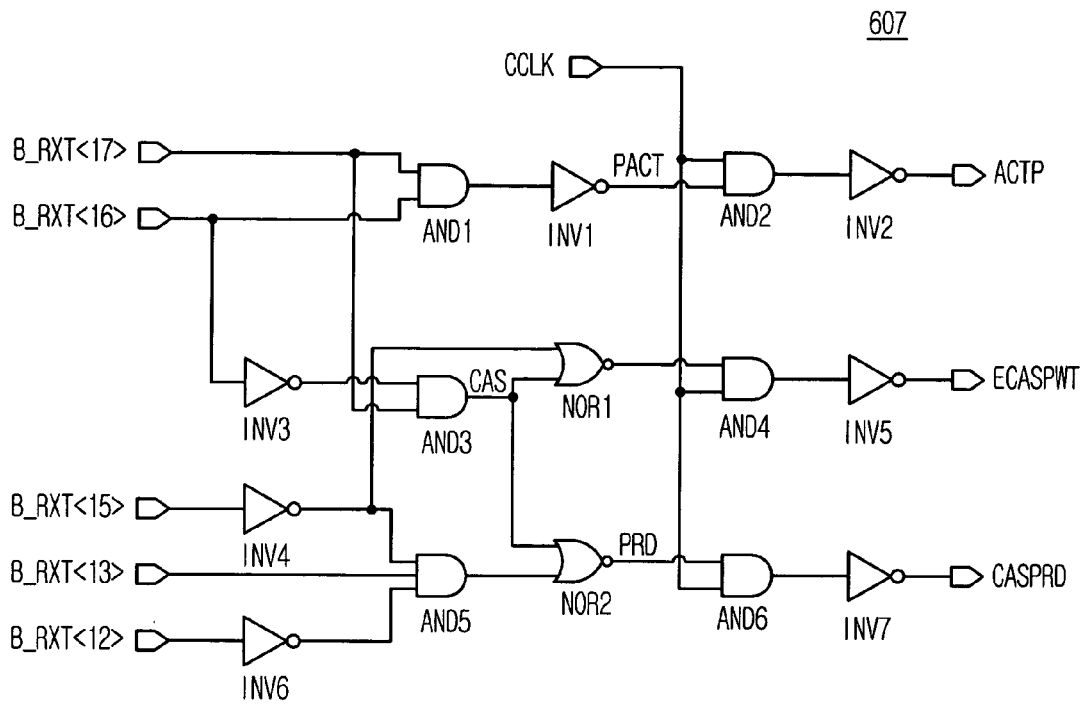
FIG. 7 is a circuit diagram of a command decoder of first command signal generating unit shown in FIG. 5.

FIG. 7 is a circuit diagram of the command decoder 607 of the first command signal generating unit shown in FIG. 5.

The command decoder 607 includes first to sixth AND gates AND1 to AND6, first to seventh inverters INV1 to INV7, and first and second NOR gate NOR1 and NOR2.

The first AND gate AND1 performs an AND operation to a $17^{th}$ bit B_RXT<17> "CMD" and a $16^{th}$ bit B_RXT<16> "ACT" of the output data B_RXT<0:17>. The first inverter INVL inverts an output of the first AND gate AND1 to output a pre-active command signal PACT. The second AND gate AND2 performs an AND operation to the pre-active command signal PACT and the second delayed clock signal CCLK output from the second delay unit 603. The second inverter INV2 inverts an output of the second AND gate AND2 to output the active command signal ACTP.

The third inverter INV3 inverts the 16$^{th}$ bit B_RXT<16> "ACT" of the output data B_RXT<0:17>. The third AND gate AND3 performs an AND operation to an output of the third inverter INV3 and the 17$^{th}$ bit B_RXT<17> "CMD" of the output data B_RXT<0:17>, thereby outputting a pre-read command signal CAS. The fourth inverter INV4 inverts a 15$^{th}$ bit B_RXT<15> "WT" of the output data B_RXT<0:17>. The first NOR gate NOR1 performs a NOR operation to an output of the fourth inverter INV4 and the pre-read command signal CAS. The fourth AND gate AND4 performs an AND operation to the pre-read command signal CAS and the second delayed clock signal CCLK. The fifth inverter INV5 inverts an output of the fourth AND gate AND4 to output the write command signal ECASPWT.

The sixth inverter INV6 inverts a 12$^{th}$ bit B_RXT<12> "ESC" of the output data B_RXT<0:17>. The fifth AND gate AND5 performs an AND operation to a 13$^{th}$ bit B_RXT<13> "RD" of the output data B_RXT<0:17> and outputs of the fourth and sixth inverters INV4 and INV6. The second NOR gate NOR2 performs a NOR operation to an output of the fifth AND gate AND5 and the pre-read command signal CAS, thereby outputting a pre-write command signal PRD. The sixth AND gate AND6 performs an AND operation to the pre-read command signal PRD and the second delayed clock signal CCLK. The seventh inverter INV7 inverts an output of the sixth AND gate AND6 to output the read command signal CASPRD.

Figure 8:
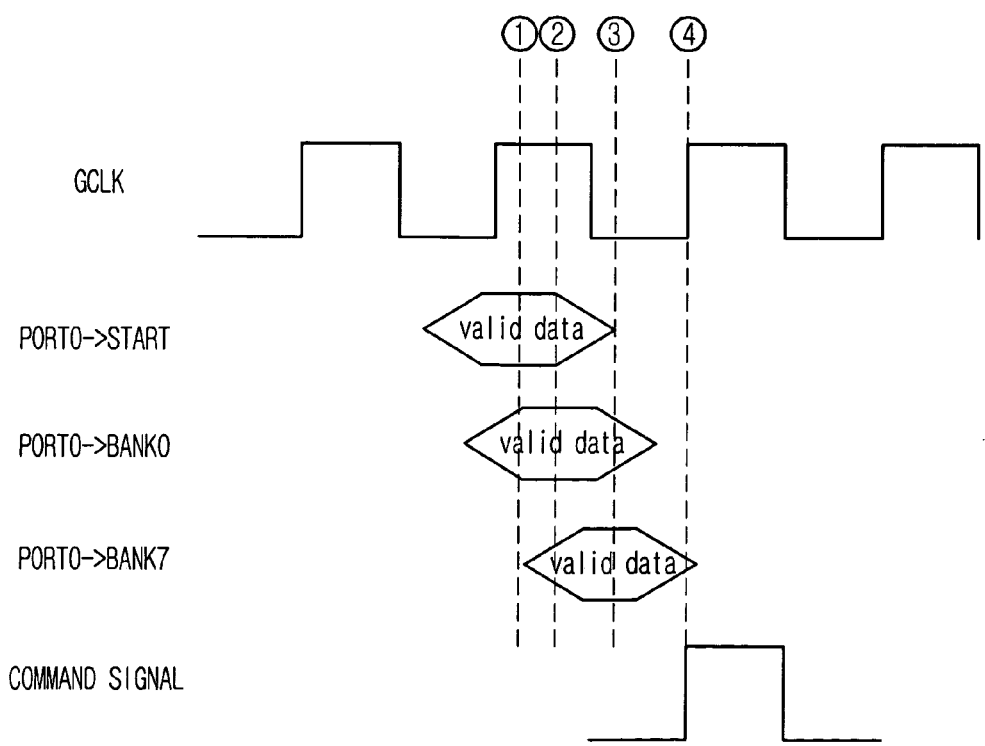
FIG. 8 is a timing diagram showing an operation of the first command signal generating unit shown in FIG. 5.

FIG. 8 is a timing diagram showing an operation of the first command signal generating unit shown in FIG. 5.

Each port PORT0 to PORT3 transmits the parallel data PORTi_RX<0:17> to each bank control logic unit BCL0 to BCL7 via the second global I/O bus GIO_IN. (see ①). At this time, the parallel data PORTi_RX<0:17> are applied with the time lag due to the loading difference between the bank control logic units BCL0 to BCL7 (see ② and ③). The present invention includes the first and second repeaters 301 and 303 for repeating the global clock bar signal GCLKB and generating the first to fourth sub-global clock signals GCLK_01 to GCLK_67 having different the delay times according to the bank control logic units BCL0 to BCL7. Accordingly, all of bank control logic units BCL0 to BCL7 receive the parallel data PORTi_RX<0:17> from the first and fourth ports PORT0 to PORT3 in response to its own sub-global clock signal. As a result, it is possible to reduce the time lag due to the loading difference of the second global I/O bus GIO_IN between the bank control logic units BCL0 to BCL7.

Furthermore, the command signal generating unit of each bank control logic unit BCL0 to BCL7 delays the global clock bar signal GCLKB to generate the second delayed clock signal CCLK, and generates the internal command signals in response to the second delayed clock signal CCLK so that the internal command signals are generated after the parallel data PORTi_RX<0:17> input to all of the bank control logic units BCL0 to BCL7 are applied. Accordingly, the command signal generating unit of each bank control logic unit BCL0 to BCL7 generates the internal command signals at the same time (see ④).

As described above, in accordance with the present invention, the multi-port memory device generates the internal command by simultaneously inputting the global clock bar signal GCLKB from the PLL to each bank control logic unit BCL0 to BCL7. After inputting the global clock bar signal GCLKB simultaneously, each bank control logic unit BCL0 to BCL7 delays its own global clock bar signal GCLKB by a predetermined time and generates the internal clock signals in response to the delayed clock signal so as to generate the internal command signals after the parallel data PORTi_RX<0:17> input to all of the bank control logic units BCL0 to BCL7 are applied. As a result, each bank control logic unit BCL0 to BCL7 of the present invention can generate the internal command signals simultaneously.

Further, the multi-port memory device in accordance with the present invention can easily set a generation point of the command signals, and has good performance of a clock time in a DRAM core, i.e., tCK, because variation of the command signals at the generation point of the command signals is small.

The present application contains subject matter related to Korean patent application No. 2006-91628, filed in the Korean Intellectual Property Office on Sep. 21, 2006, the entire contents of which are incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A multi-port memory device including a plurality of ports, a plurality of banks and a plurality of bank controllers, wherein all of the bank controllers share all of the ports, the device comprising:
   a phase locked loop (PLL) unit for generating an internal clock signal;
   a delay unit, provided in each bank controller, for generating first and second delayed clock signals by delaying the internal clock signal;
   a serializer, provided in each bank controller, for receiving a plurality of parallel data from all of the ports in response to the first delayed clock signal; and
   a command decoder, provided in each bank controller, for decoding output data of the serializer to generate command signals in response to the second delayed clock signal.

2. The multi-port memory device as recited in claim 1, wherein the first and second delayed clock signals includes information relating to a delay time while the plurality of parallel data from all of the ports are applied to the bank controllers.

3. The multi-port memory device as recited in claim 1 wherein the PLL unit includes repeaters for simultaneously transmitting the internal clock signal to the bank controllers.

4. The multi-port memory device as recited in claim 1, wherein the delay unit includes:
   a first delay unit for delaying the internal clock signal by a predetermined time to generate the first delayed clock signal; and
   a second delay unit for delaying the first delayed clock signal by a predetermined time to generate the second delayed clock signal.

5. The multi-port memory device as recited in claim 4, wherein each of the first and second delay units includes a plurality of inverters.

6. The multi-port memory device as recited in claim 1, wherein the serializer includes a flip-flop.

7. The multi-port memory device as recited in claim 1, wherein the serializer includes:
   a multiplexing unit for selecting one of the plurality of parallel data from all of the ports in response to a bank selection signal, and fitting the selected parallel data for the corresponding data frame;
   an inverter for inverting the first delayed clock signal;

a transmission unit for transmitting the selected parallel data in response to an output of the inverter; and a latch unit for latching an output of the transmission unit.

8. The multi-port memory device as recited in claim 1, wherein the command decoder includes:

a first signal generating unit for receiving a command bit and an active command bit of the output data of the serializer to generate an active command signal;

a second signal generating unit for receiving the command bit, the active command bit and a write command bit of the output data of the serializer to generate a write command signal; and a third signal generating unit for receiving the write command bit, a read command bit and a command expansion bit of the output data of the serializer to generate a read command signal, wherein the second delayed clock signal is input to the first to third signal generating units.

9. The multi-port memory device as recited in claim 8, wherein the first signal generating unit includes:

a first AND gate for performing an AND operation on the command bit and the active command bit;

a first inverter for inverting an output of the first AND gate to output a pre-active command and signal;

a second AND gate for performing an AND operation on the pre-active command signal and the second delayed clock signal; and a second inverter for inverting an output of the second AND gate to output the active command signal.

10. The multi-port memory device as recited in claim 9, wherein the second signal generating unit includes:

a third inverter for inverting the active command bit;

a third AND gate for performing an AND operation on an output of the third inverter and the command bit and outputting a pre-read command signal;

a fourth inverter for inverting the write command bit;

a first NOR gate for performing a NOR operation on an output of the fourth inverter and the pre-read command signal;

a fourth AND gate for performing an AND operation on the pre-read command signal and the second delayed clock signal; and a fifth inverter for inverting an output of the fourth AND gate to output the write command signal.

11. The multi-port memory device as recited in claim 10, wherein the third signal generating unit includes:

a sixth inverter for inverting the command expansion bit;

a fifth AND gate for performing an AND operation on a the read command and outputs of the fourth and sixth inverters;

a second NOR gate for performing a NOR operation on an output of the fifth AND gate and the pre-read command signal, and outputting a pre-write command signal;

a sixth AND gate for performing an AND operation on the pre-read command signal and the second delayed clock signal; and a seventh inverter for inverting an output of the sixth AND gate to output the read command signal.

12. A multi-port memory device, comprising:

a plurality of ports for performing a serial input/output (I/O) communication with external devices;

a plurality of banks for performing a parallel I/O communication with the ports through a plurality of global I/O lines;

a plurality of bank controllers, each corresponding to each of the banks, for sharing the plurality of global I/O lines and controlling the parallel I/O communication between the ports and the banks; and a phase locked loop (PLL) unit for generating an internal clock signal and simultaneously transmitting the internal clock signal to the bank controllers, wherein each of the bank controllers includes a command signal generating unit for simultaneously generating command signals in response to the internal clock signal, and the PLL unit includes repeaters for simultaneously transmitting the internal clock signal to the bank controllers.

13. The multi-port memory device as recited in claim 12, wherein the command signal generating unit includes:

a delay unit for generating first and second delayed clock signals by delaying the internal clock signal;

a serializer for receiving a plurality of parallel data from all of the ports in response to the first delayed clock signal; and a command decoder for decoding output data of the serializer to generate the command signals in response to the second delayed clock signal.

14. The multi-port memory device as recited in claim 13, wherein the first and second delayed clock signals include information relating to a delay time while the plurality of parallel data from all of the ports are applied to the bank controllers.

15. The multi-port memory device as recited in claim 13, wherein the delay unit includes:

a first delay unit for delaying the internal clock signal by a predetermined time to generate the first delayed clock signal; and a second delay unit for delaying the first delayed clock signal by a predetermined time to generate the second delayed clock signal.

16. The multi-port memory device as recited in claim 15, wherein each of the first and second delay units includes a plurality of inverters.

17. The multi-port memory device as recited in claim 13, wherein the serializer includes a flip-flop.

18. The multi-port memory device as recited in claim 13, wherein the serializer includes:

a multiplexing unit for selecting one of the plurality of parallel data from all of he ports in response to a bank selection signal, and fitting the selected parallel data for the corresponding data frame;

an inverter for inverting the first delayed clock signal;

a transmission unit for transmitting the selected parallel data in response to an output of the inverter; and a latch unit for latching an output of the transmission unit.

19. The multi-port memory device as recited in claim 13, wherein the command decoder includes:

a first signal generating unit for receiving a command bit and an active command bit of the output data of the serializer to generate an active command signal;

a second signal generating unit for receiving the command bit, the active command bit and a write command bit of the output data of the serializer to generate a write command signal; and a third signal generating unit for receiving the write command bit, a read command bit and a command expansion bit of the output data of the serializer to generate a read command signal, wherein the second delayed clock signal is input to the first to third signal generating units.

20. The multi-port memory device as recited in claim 19, wherein the first signal generating unit includes:

a first AND gate for performing an AND operation on the command bit and the active command bit;

a first inverter for inverting an output of the first AND gate to output a pre-active command signal;

a second AND gate for performing an AND operation on the pre-active command signal and the second delayed clock signal; and a second inverter for inverting an output of the second AND gate to output the active command signal.

21. The multi-port memory device as recited in claim 20, wherein the second signal generating unit includes:

a third inverter for inverting the active command bit;

a third AND gate for performing an AND operation on an output of the third inverter and the command bit and outputting a pre-read command signal;

a fourth inverter for inverting the write command bit;

a first NOR gate for performing a NOR operation on an output of the fourth inverter and the pre-read command signal;

a fourth AND gate for performing an AND operation on the pre-read command signal and the second delayed clock signal; and a fifth inverter for inverting an output of the fourth AND gate to output the write command signal.

22. The multi-port memory device as recited in claim 21, wherein the third signal generating unit includes:

a sixth inverter for inverting the command expansion bit;

a fifth AND gate for performing an AND operation on a the read command and outputs of the fourth and sixth inverters;

a second NOR gate for performing a NOR operation on an output of the fifth AND gate and the pre-read command signal, and outputting a pre-write command signal;

a sixth AND gate for performing an AND operation on the pre-read command signal and the second delayed clock signal; and a seventh inverter for inverting an output of the sixth AND gate to output the read command signal.

* * * * *